United States Patent [19]
Schlais et al.

[11] Patent Number: 5,969,382
[45] Date of Patent: Oct. 19, 1999

[54] EPROM IN HIGH DENSITY CMOS HAVING ADDED SUBSTRATE DIFFUSION

[75] Inventors: John Robert Schlais, Gurnee, Ill.; Randy Alan Rusch, Kokomo, Ind.

[73] Assignee: Delco Electronics Corporation, Kokomo, Ind.

[21] Appl. No.: 08/963,463

[22] Filed: Nov. 3, 1997

[51] Int. Cl.[6] .................................................. H01L 29/788
[52] U.S. Cl. .......................... 257/315; 257/296; 257/317; 257/321; 257/390; 438/257; 438/261; 438/264; 438/265; 365/185.14; 365/185.15
[58] Field of Search .................................... 257/296, 297, 257/315, 317, 321, 390, 258; 438/257, 261, 262, 264, 265, 266; 365/185.14, 185.15

[56] References Cited

U.S. PATENT DOCUMENTS

5,014,098  5/1991  Schlais et al. ......................... 357/23.5

*Primary Examiner*—Valencia Martin-Wallace
*Attorney, Agent, or Firm*—Jimmy L. Funke

[57] ABSTRACT

A method of making an EPROM transistor in a high density CMOS integrated circuit having a substrate to gate electrode material capacitor. The EPROM transistor is made using only the steps used to make the other components of the high density CMOS integrated circuit. The EPROM transistor is programmable at low voltages which high density CMOS transistors can handle.

17 Claims, 7 Drawing Sheets

EPROM IN HIGH DENSITY CMOS HAVING ADDED SUBSTRATE DIFFUSION

RELATED PATENT APPLICATIONS AND PATENT

This patent application is related to the following two patent applications, that were filed on or about the same date as this patent application, that were filed in the names of J. R. Schlais and R. A. Rusch, and that are assigned to the same assignee as this patent application:

Attorney docket number H-188616, entitled "EPROM in Double Poly High Density CMOS"; and Attorney docket number H-194838, entitled "EPROM in High Density CMOS With Metallization Capacitor".

This patent application is also related to U.S. Pat. No. 5,014,098, entitled "CMOS Integrated Circuit with EEPROM and Method of Manufacture", that was issued May 7, 1991 to J. R. Schlais, R. A. Rusch and T. H. Simacek, and assigned to the assignee of this patent application.

The above disclosures are incorporated herein by reference.

BACKGROUND OF THE INVENTION

1. Field of the Invention

This invention relates to a CMOS integrated circuit having an EPROM incorporated therein, and to a method of making the same. More particularly, this invention relates to an EPROM structure that is manufacturable using precisely the same process steps that are used to make a small geometry, i.e., high density, CMOS integrated circuit. In other words, no steps need be added to or subtracted from those used in making the small geometry CMOS integrated circuit. Accordingly, the EPROM can be made on the same chip as the small geometry CMOS transistors without compromising the CMOS transistors in any way, especially their speed of operation.

2. Description of the Prior Art

As indicated above, this invention relates to a high density CMOS integrated circuit having an EPROM (electrically programmable read only memory) device. The term "CMOS" is used in its usual context, but is also hereinafter defined for completeness of disclosure. An "EPROM" is a nonvolatile memory integrated circuit unit. It is thus an integrated circuit that has a memory that remains without the need of a power source. Hence, it is a lasting, or permanent, memory. As indicated by its name, an EPROM nonvolatile memory unit can be electrically programmed after manufacture. In addition, the programming, i.e., also the memory, can be erased as a single block by exposing the EPROM chip to ultraviolet light.

The EPROM is not to be confused with an EEPROM (electrically erasable programmable read only memory) device. An EEPROM is thus a nonvolatile memory integrated circuit unit. However, its programming can be selectively changed, i.e., erased, at each of its MOS transistor memory gates. Moreover, the EEPROM programming is changed electrically, not by the application of ultraviolet light. This requires additional process steps on an integrated circuit chip, which increases its cost significantly.

The EPROM and EEPROM nonvolatile memory integrated circuits are comprised of special types of MOS (metal oxide semiconductor) transistors that are often arranged in arrays. As is known, MOS transistors are also referred to as insulated gate field effect transistors (IGFET). An IGFET has a control gate electrode that is disposed over a channel region that extends between spaced but adjacent source and drain regions embedded in a semiconductor surface. IGFETs of an EPROM and EEPROM memory array are a special form of IGFET in that they also have a second gate electrode. We sometimes herein refer to such IGFETs as EPROM transistors. The second gate electrode of such transistors is an electrically floating electrode that is disposed above the IGFET channel region but below the control gate electrode hereinbefore mentioned. It is electrically floating because it is electrically insulated from the control gate above it and the channel region below it, and has no electrical conductor for accessing it. An electrical charge is normally placed on the floating gate by the effects of tunneling or avalanche injection. Once an electrical charge is placed on the floating gate, the charge is trapped there until it is deliberately removed in some way.

The trapped charge on the floating gate raises the threshold voltage of the underlying channel region of that IGFET. This raises the "turn on" voltage of that IGFET to a value above the voltage usually applied to turn that IGFET "on". Accordingly, that IGFET stays "off" even when a normal turn on voltage is applied to its gate. A floating gate IGFET memory unit of an EPROM or EEPROM memory array is thus "programmed" from a "one" to a "zero" by charging its floating gate. Selected floating gate IGFETs in an EPROM or EEPROM memory array which have been so programmed, will not turn on when the usual "turn on" voltage is applied to them. So programming the selected IGFETs of an EPROM or EEPROM memory array is also referred to herein as programming the EPROM or EEPROM memory. Such "programming" can be erased, i.e., removed, by exposing an EPROM or EEPROM memory array to ultraviolet light, which allows the trapped charge on the floating gate of each programmed IGFET to escape. Such "programming" of an EEPROM can more conveniently be erased electrically by applying an appropriate electrical potential between the control (or "charging") gate and the channel of each programmed IGFET.

The related U.S. Pat. No. 5,014,098 relates to forming an EEPROM in a CMOS integrated circuit. It discusses the difficulties of the past in including nonvolatile memory devices in high density CMOS integrated circuit applications. In order to achieve high packing density, the cell size of the nonvolatile memory was minimized. One convenient way to reduce the cell size was to use a high programming voltage, allowing the capacitance between the control (or "charging") gate and the floating gate to be small. For Fowler-Nordheim tunneling, the tunnel oxide current equation dictates an absolute value of voltage required to pass tunnel current through it for a given tunnel oxide thickness. To obtain this voltage on the floating gate, the control gate voltage has to be increased when the ratio of control gate/floating gate capacitance to floating gate/substrate capacitance is small. Also, for such tunneling to occur, a portion of the oxide between the floating gate and the channel must be thinner than is ordinarily used in the high density CMOS transistors.

The voltage applied to the floating gate (to achieve programming) is determined by the voltage applied to the control gate, and the ratio of (a) the control gate to floating gate capacitance to (b) the floating gate to substrate capacitance. This is what we mean by programming capacitance ratio. As the programming capacitance ratio increases, the programming voltage reduces. In other words, with a higher programming capacitance ratio, a lower control gate voltage can be used to trap enough charge on the floating gate to noticeably raise IGFET threshold voltage.

The capacitive ratio is primarily affected by the layout of the cell, i.e., a larger cell size will typically have a larger capacitance ratio. U.S. Pat. No. 5,014,098, shows that the floating gate and the control gate can be laid out with integral mutually overlapping plate-like enlargements that extend up onto field oxide adjacent the channel region of the EEPROM IGFET from which they extend. This increases the capacitance between the two gates without significantly increasing the floating gate to substrate (i.e., channel) capacitance.

There are many applications where it is desirable to combine nonvolatile memory with CMOS logic circuits. CMOS logic circuits are formed of complementary MOS transistors, or IGFETs. By complementary, we mean that the MOS transistors include both n-channel and p-channel MOS transistors. If one desires to make such logic circuits in high density (for high performance logic), the high density, i.e., small geometry, nonvolatile memory must be designed with relatively deep source and drain junctions and thick field oxides, to accommodate high voltage programming. On the other hand, high density CMOS ideally should have shallow junctions, thinner gate oxides and thinner field oxides, because it would operate at 5 volts or less. Attempts to integrate even small amounts of such high density nonvolatile memory circuity with a high density CMOS logic circuitry, necessitates that the entire integrated circuit be dominated in some key respects by the requirements of the nonvolatile memory high voltage circuitry. The nonvolatile memory requirements tend to degrade the performance and reliability of the high density and low voltage CMOS logic, which typically has shallow source and drain junctions, thinner gate oxides and thinner field oxides. The high voltage junctions used in the nonvolatile memory devices require deeper diffusions, which leads to longer channel lengths for the CMOS logic, to avoid short channel effects. This is undesirable since it results in slower logic devices. The thick field oxide of the nonvolatile memory device increases the lateral encroachment, or "birds beak", in the CMOS logic. Hence, a greater limitation is present in the minimum pitch of doped regions. Another, and longer range, result of this is the limited shrinkability of such an integrated circuit device and process with a high density/high voltage nonvolatile memory device included.

At present, when forming a CMOS logic circuit with an EPROM or EEPROM device in a stacked polycrystalline silicon FLOTOX technology, i.e., polycrystalline silicon gates and a thin insulator for electron tunneling, compromises are required in order to insure that one of the polycrystalline layers of the nonvolatile memory device can be shared with the logic devices. This is usually done in one of two ways. One method is to first define the floating gate of the EPROM or EEPROM. A high temperature dielectric oxide is then grown which also serves as the gate oxide of the CMOS devices and the control gate dielectric of the nonvolatile memory device. Then the second layer of polycrystalline silicon is used to form the CMOS gates and the nonvolatile memory control gate. Thus, the same layer of polycrystalline silicon is shared for the control gate of the nonvolatile memory device and the CMOS gates. In this method, formation of the high temperature dielectric oxide for the CMOS and control gate tends to degrade the characteristics of the tunnel oxide in the nonvolatile memory device. This high temperature also shifts the implants in the CMOS devices, and thus creates a shift in the electrical characteristics of the resultant CMOS devices from what the original CMOS process would produce without inclusion of the nonvolatile memory device processing. Also, it is difficult to make a reliable gate dielectric from the silicon dioxide grown between the floating gate and the control gate of the nonvolatile memory device.

The second method is to grow the gate oxide and then mask and etch the windows for the tunnel oxide. A precleaning step for growth of the tunnel oxide then follows. The tunnel oxide is then grown, followed by a prepolycrystalline silicon deposition cleaning step and a polycrystalline silicon deposition step. The first polycrystalline silicon layer is shared between the CMOS devices and the floating gate of the nonvolatile memory device. In this latter prior art method, the steps required between the gate oxidation and polycrystalline silicon deposition degrade the gate oxide and thus the performance of the CMOS circuit. The gate oxide is degraded by placing photoresist on it for the tunnel mask, the pre-tunnel oxide clean, and the tunnel oxidation itself. These steps may introduce contaminants into the gate oxide, and will certainly alter the thickness of the gate oxide during the tunnel oxidation.

It is therefore desirable to have a high reliability CMOS logic circuit in which a nonvolatile memory device can be included with negligible impact on both the CMOS circuit and the nonvolatile memory device. The related U.S. Pat. No. 5,014,098 shows how an EEPROM can be so included by adding process steps to the usual CMOS process that only have negligible impact on the CMOS devices. On the other hand, it is to be noted that additional process steps do in fact have to be included, which increases cost of the process, and might slightly reduce yields. In addition, the added conductor pattern needed for electrically erasing an EEPROM, significantly expands the size an EEPROM nonvolatile memory unit over that of an EPROM nonvolatile memory. This can increase cost significantly.

As indicated above, the nonvolatile memory device that is made in the related U.S. Pat. No. 5,014,098 is an EEPROM, not an EPROM. An electrical charge can be put on its floating gate by any one of several techniques, including the Fowler-Nordheim Tunneling action shown in the related U.S. Pat. No. 5,014,098. However, Fowler-Nordheim Tunneling requires that a spot of the gate oxide on the channel region be thinner than normal gate oxide. As also indicated above, this requires adding special steps to the process used to make the CMOS integrated circuit, to form the thinner oxide. However, the addition of the extra steps is offset by the benefit that the thinner oxide also permits electrical erasing by Fowler-Nordheim Tunneling, as disclosed in the related U.S. Pat. No. 5,014,098. Hence, Fowler-Nordheim Tunneling permits easy, fully electrical, reprogramming of the EEPROM on a selective IGFET basis.

We have now recognized that electrical erasing of a PROM is often not needed. In fact, no erasing at all may be needed, or that erasing prior to encapsulation is all that might be needed. In addition, we have recognized that block erasing, as opposed to selective IGFET erasing, may be satisfactory in many applications. Accordingly, we have recognized that an EPROM nonvolatile memory may be as useful as an EEPROM nonvolatile memory in many applications. Further, we have recognized that avalanche injection can be used to charge the floating gate of an EPROM using normal "gate" oxide thicknesses, i.e., oxide thickness between the floating gate and its underlying channel region. Still further, we have recognized that avalanche injection into the floating gate of an EPROM can be done at low voltages if the control gate/floating gate to floating gate/ substrate capacitance ratio is about two or greater. Still further, we have found that an EPROM can be included in a high performance CMOS integrated circuit unit using exactly the same process steps as are used to make the high performance CMOS transistors in such a unit. In other words, no steps need to be added to or subtracted from the high performance CMOS process in order to also make the EPROM on the same chip. All that is needed is to include our special EPROM structure features in selected ones of the masks used to make the CMOS circuitry. Accordingly, in our invention, a nonvolatile memory unit can be included in a CMOS integrated circuit made with two micron or less design rules, without any penalties or compromises at all in the CMOS circuitry.

SUMMARY OF THE INVENTION

The present invention is directed to an integrated circuit which comprises a distinctive erasable programmable read only memory (EPROM) combined in a unique way in a monolithic initegrated circuit with high speed, or high performance, CMOS circuitry. By CMOS circuitry, we mean circuitry that is predominantly formed with complementary metal oxide semiconductor (MOS) transistors, i.e., n-channel and p-channel MOS transistors. As indicated above, MOS transistors are also referred to as IGFETs. By high speed, we mean that the design rule channel length of the CMOS transistors is about 2 microns or less. Ordinarily, the circuitry being referred to is CMOS logic circuitry on a monolithic integrated circuit chip, as, for example, a microprocessor chip. It is not unusual for other forms of circuitry also to be present on such a chip.

Thus, in the present invention, we focus on a monolithic integrated circuit that includes high performance CMOS circuitry and also some EPROM nonvolatile memory. The CMOS circuitry (i.e., the logic circuitry) is high performance because it has small geometry devices (i.e., two micron or less channel lengths), which gives the CMOS circuitry high density and high speed. An important feature of the invention is that the EPROM is present without adversely affecting the high performance characteristics of the CMOS circuitry. Another important feature of the invention is that the EPROM is made using the exactly the same process steps used to make the high performance CMOS part of the circuitry. We sometimes refer to the high performance CMOS process steps as "two micron" process steps. By "two micron CMOS process", we mean a CMOS process having design rules allowing the mask for etching a polycrystalline silicon layer, which forms an IGFET gate electrode, to have a feature size of about two microns. By "feature size", we mean the nominal linear dimension of a polycrystalline silicon gate electrode between its associated source and drain in an IGFET. This dimension is also referred to as gate length of an IGFET. Accordingly, in our invention, the feature size of at least the CMOS circuitry in the integrated circuit is about two microns. With source and drain junction depths of about 0.35 micron, and a design rule feature size of two microns, the actual resulting channel length will be about 1.5 microns, due to lateral diffusion of the source and drain regions under opposite edges of the polysilicon gate electrode.

IGFETs having channel lengths less than two microns are often considered to be "high performance" or "high speed" in logic operation. For purposes of this invention, when we refer to a "high speed CMOS process", we mean a process capable of making CMOS logic IGFETs having channel lengths of less than about two microns. The EPROM may or may not have such a feature size, depending on the application.

In addition, the EPROM of this invention is programmable at voltages low enough to be handled by the high speed CMOS circuitry, which is usually about 5 volts or less. Accordingly, the high speed CMOS circuitry can be used to program the EPROM. This is true even though the EPROM has relatively thick gate oxide that does not permit Fowler-Nordheim tunneling.

In this invention, the high speed CMOS integrated circuit is one that would include a substrate to poly capacitor, such as what might be used to make a relatively moderate value capacitor in the high speed CMOS integrated circuit. Such a moderate value capacitor is made by providing a relatively large substrate diffusion area, in addition to the MOS transistor relatively small "active" areas, covering the relatively large substrate diffusion area with silicon oxide, and then overlapping it with a relatively large electrode of polycrystalline silicon. In this invention, we select some of the same steps used to produce the MOS transistors and the substrate to poly capacitors, and then combine them to also make distinctive floating gate and control (or "charging") gate structures for our EPROM. These distinctive gate structures provide a capacitance ratio, between (a) the control gate to floating gate capacitance and (b) the floating gate to substrate (i.e., essentially the IGFET channel) capacitance, of about 2 or greater.

Such a capacitance ratio of about 2 or more permits the EPROM to have a normal gate oxide thickness under the floating gate and yet be programmable at voltages less than the parasitic breakdown voltages of the high speed CMOS circuitry. By "normal" gate oxide thickness, we mean the same gate oxide thickness that is used for the CMOS circuitry on that silicon chip. Accordingly, all that is needed to include an EPROM in a high performance CMOS circuit, is to incorporate some changes in selected masks used to make the CMOS circuit. No process steps need be added to the high speed CMOS process, as is needed in U.S. Pat. No. 5,014,098 Schlais, et al.

Other objects, features and advantages of this invention will become more apparent from the following detailed description taken together with the accompanying drawing and claims.

BRIEF DESCRIPTION OF THE DRAWING

FIGS. 1–18 successively show use of a typical CMOS two micron process with substrate to poly capacitor to form in that surface portion (from left to right in the Figures) a p-channel IGFET, and n-channel IGFET, a substrate to poly capacitor, and an EPROM that uses a substrate diffusion as a charging gate. A two micron process is explained above. In this invention, the charging gate of the EPROM is formed at the same time and by the same process steps that are used to form the bottom plate of the substrate to poly capacitor. The polycrystalline silicon layer that is used to form the IGFET gate electrodes is used to form the floating gate of our distinctive EPROM. It is defined at the same time the high speed CMOS IGFET gate electrodes are defined.

It should be understood that the various sheets of the Drawing are not necessarily drawn to scale, and exaggerations in thickness and relative sizes have been made to facilitate an easier understanding of the invention. Also, for easier comparison with the contemporaneously filed related patent Attorney Docket H-188616 referred to above, similar reference numerals for similar parts of the Drawing are used, to the extent practical. However, this invention differs from Attorney Docket H-188616 by having a diffusion for a substrate to poly capacitor and by not having a second layer of polycrystalline silicon. Reference numerals relating to the formation of the second layer of polysilicon in the above-mentioned related Attorney Docket H-188616 are thus omitted in this description. Reference numerals relating to the inclusion of the substrate to poly capacitor at silicon surface area 12d are added. Except where believed to be helpful, background lines are omitted in the Figures for added clarity of illustration.

DETAILED DESCRIPTION

Figure 1:
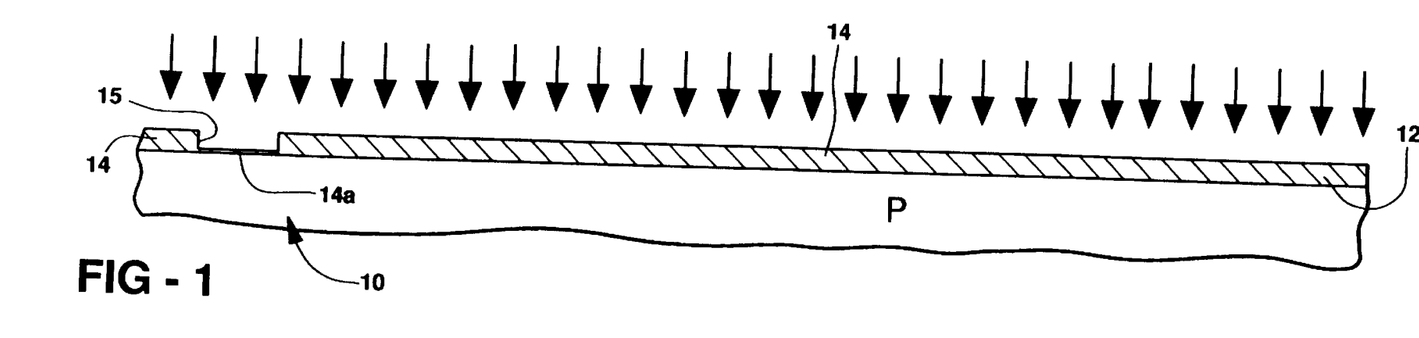
FIGS. 1–18 each show a cross-sectional view through the same surface portion of a monocrystalline silicon wafer. The silicon surface portion shown in FIGS. 1–18 is but one part of one chip in a silicon wafer that contains a plurality of such chips.

As shown in FIG. 1, a typical high speed CMOS process would start with an initial oxidation of a p-type silicon monocrystalline wafer 10. As indicated above, by high speed CMOS process, we mean a process for producing small geometry CMOS IGFETs with shallow junctions. By small geometry, we mean that the design rules for the process are for two micron or less. Also as indicated above, by a CMOS process having "two micron design rules" and/or a "two micron process", we mean a CMOS process having design rules allowing the poly etch mask (i.e., the mask used for etching a polycrystalline silicon layer) to define an IGFET gate electrode, to have a feature size of about two microns. By "feature size", we mean the linear dimension of an IGFET polycrystalline silicon gate electrode between its associated source and drain regions. This dimension can also be referred to as the design gate length. However, in the resultant IGFET, the actual channel length under the gate electrode is slightly less than the feature size. This is due to lateral diffusion of the source and drain regions under the outer edges of the gate electrode. For example, with source and drain junction depths of about 0.35 micron, lateral diffusion under opposed edges of a gate electrode of two micron feature size produces an actual channel length of about 1.5 microns. To avoid possible confusion, we refer to the gate electrode as having a "length" between source and drain regions (not a "width"), to be consistent with the language used in referring to channel length.

IGFETs with such small channel lengths operate at higher speed. That is why IGFETs having channel lengths less than two microns can provide "high performance" or "high speed" in logic operation. For purposes of this invention, when we refer to a "high performance CMOS process" or a "high speed CMOS process", we mean a process capable of making CMOS logic IGFETs having channel lengths of less than about two microns.

As indicated above, in this invention an EPROM is concurrently made in a CMOS silicon chip along with a substrate to poly capacitor. Our EPROM is made using selected ones of the same steps that are used to make the high performance CMOS, combined with selected ones of the same steps used to make the substrate to poly capacitor. The monocrystalline silicon wafer 10 can be a homogeneous or epitaxial wafer having a surface 12 in which a plurality of integrated circuit chips would be integrally formed. Silicon surface 12 of each such chip would have many complementary transistor pairs and at least some substrate to poly capacitors. While not shown, it might also have some poly resistors formed on the field oxide, or have diffused or ion implanted resistors formed in the silicon surface 12. In this invention, the silicon surface 12 would also have an EPROM. For simplicity, the drawing shows formation of only one CMOS pair, one substrate to poly capacitor, and one EPROM. The reason is that in this invention, our distinctive EPROM structure is made by combining selected ones of the steps used to make each IGFET of the CMOS pair and the substrate to poly capacitor.

The surface 12 of the silicon wafer 10 would preferably be doped p-type with boron to a conductivity of about 10–20 ohm-cm. Then, the surface 12 of wafer 10 is thermally oxidized. The thermal oxidation forms a silicon oxide blanket layer 14 of about 5500 angstroms thick on silicon surface 12, as shown in FIG. 1. Then, as also shown in FIG. 1, a window 15 is photolithographically opened in a portion of the oxide layer 14 over each site in the silicon surface 12 where an N-well is to be formed. The silicon surface 12 is exposed in the window at each such site. Then, a thin (about 500 angstrom thick) layer 14a of silicon oxide is thermally grown on the exposed silicon surface at each such site. FIG. 1 shows the wafer surface 12 after the thin oxide layer 14a has been thermally grown.

It is to be recognized that the oxide layer 14 will thicken slightly when the thin oxide layer 14a is grown in window 15. It is also to be noted that the oxide layer 14a is thin enough to allow ions to be implanted through it into its underlying silicon surface but is thick enough to protect surface 12 from implantation damage. FIG. 1 also shows that wafer 10 is given a blanket implant of an n-type impurity such as phosphorous. The implant is given in a dose of about $1 \times 10^{12}$ to $1 \times 10^{13}$ atoms per square centimeter, at an energy of about 60 to 180 keV. The thick oxide layer 14 mask-s all of surface 12 from the implant except over the surface sites within each window 15. In each window 15, the implant penetrates the thin oxide layer 14a and lodges atoms of dopant in the underlying site of silicon surface 12.

The implanted n-type dopant at each such site is then driven-in to a depth of about 2 microns to 8 microns by heating for about 1 to 6 hours in an annealing or oxidizing atmosphere. An n-well 16 is thus formed at each such site in silicon surface 12 where there was a window 15 in the thick oxide layer 14. The n-well 16 is an island-like n-type region inset into the p-type surface 12 of silicon wafer 10. This provides an integral n-type island in the p-type wafer where p-channel IGFETs can be formed. As indicated above, the combination of such p-channel IGFETs and of n-channel IGFETs made on an adjacent part of silicon surface 12 provide a high speed CMOS pair.

Figure 2:
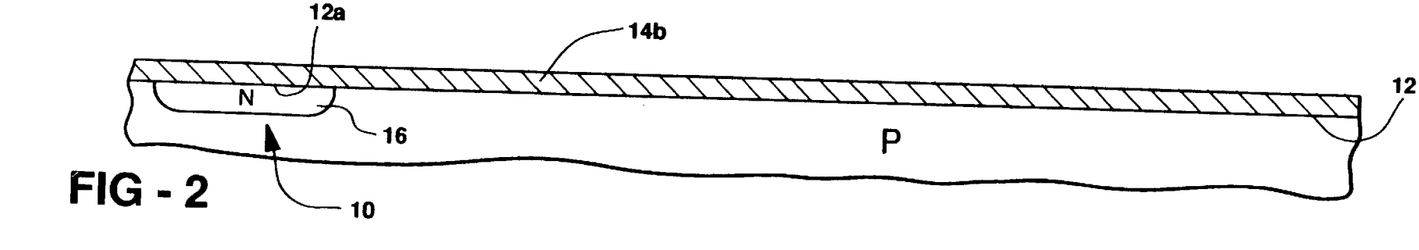

FIG. 2 shows that the thermal oxide layer 14 of FIG. 1 is removed after n-well 16 is formed, and replaced with a thin thermally grown silicon oxide blanket layer 14b. Oxide layer 14b has a thickness of about 500 angstroms.

Figure 3:
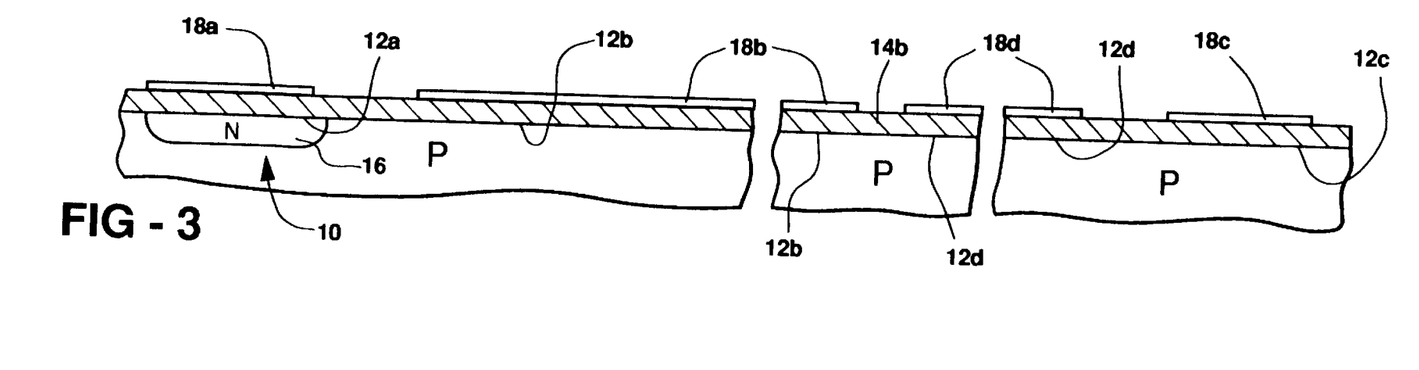
Figure 19:
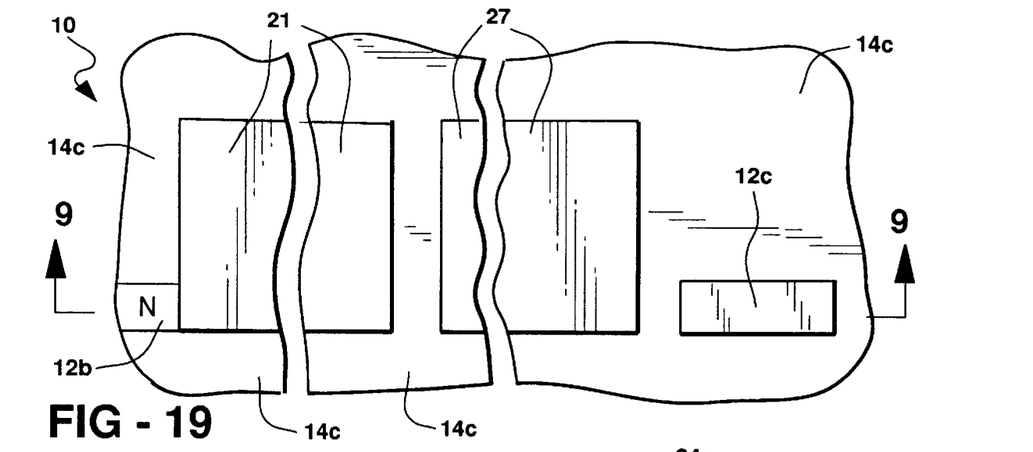
FIG. 19 shows a plan view of substrate diffusion areas for a substrate to poly capacitor and our EPROM. The view is along the line 19—19 of FIG. 9.

As can be seen from FIG. 3, thin oxide layer 14b is a pre-nitride oxidation, to prepare silicon surface 12 to receive a 1500–2500 angstrom thick silicon nitride blanket layer (not shown in blanket form) that is deposited by low pressure chemical vapor deposition (LPCVD). The silicon nitride blanket layer is then photolithographically masked and etched to form silicon nitride islands 18a, 18b, 18c and 18d on thin silicon oxide layer 14b. Silicon nitride islands 18a, 18b, 18c and 18d are respectively disposed over silicon surface areas 12a, 12b, 12c and 12d. In plan view, surface area 12a is a small rectangular area where a p-channel MOS transistor is to be formed. Silicon area 12b is an "L" shaped area in which the base of the "L" is a small rectangular area similar to and aligned with silicon area 12a. The upright part of the "L" in surface area 12b is a rectangular area that is much larger than the base of the "L". An interconnected n-channel MOS transistor and substrate to poly capacitor are to be formed in the "L" shaped surface area 12b. The n-channel MOS transistor is formed in the base of the "L". The substrate to poly capacitor is formed in the large upright part of the "L". Surface areas 12c and 12d are surface areas where our distinctive EPROM will be formed. Surface area 12d is a large rectangular area, similar to and aligned with the large rectangular upright part of "L" shaped area 12b. Surface area 12c is a small rectangular area similar to and aligned with 12a and the base of the "L" of 12b. The plan view shape of these areas can also be ascertained by reference to FIG. 19.

Surface areas 12a–12d, being covered by silicon nitride islands 18a–18d, will be protected during subsequent oxidation of surface 12. Accordingly, areas 12a–12d will be areas having a significantly lesser oxide thickness on them from subsequent processing. They are sometimes referred to as "active" areas, because "active" devices will be formed on most of them in the completed integrated circuit.

For convenience of illustration, the n-channel MOS transistor and the substrate to poly capacitor are shown in the same silicon area 12b, and interconnected through their n-type diffusion regions. This eliminates the need for a metallization contact between them. However, we recognize that one may more often prefer to place them in separate "active" areas, and not to directly interconnect them. In such instance, a separate silicon nitride island for each would be provided. For example, silicon nitride island 18b could be divided into two separate parts, one part for the n-channel MOS transistor and one part for the substrate to poly capacitor. As a result, an area of thick field oxide would be formed between them by the process of the following description, like will be formed between silicon areas 12a and 12b, between 12b and 12c, and between 12c and 12d. More will be said about such alternatives later.

Figure 4:
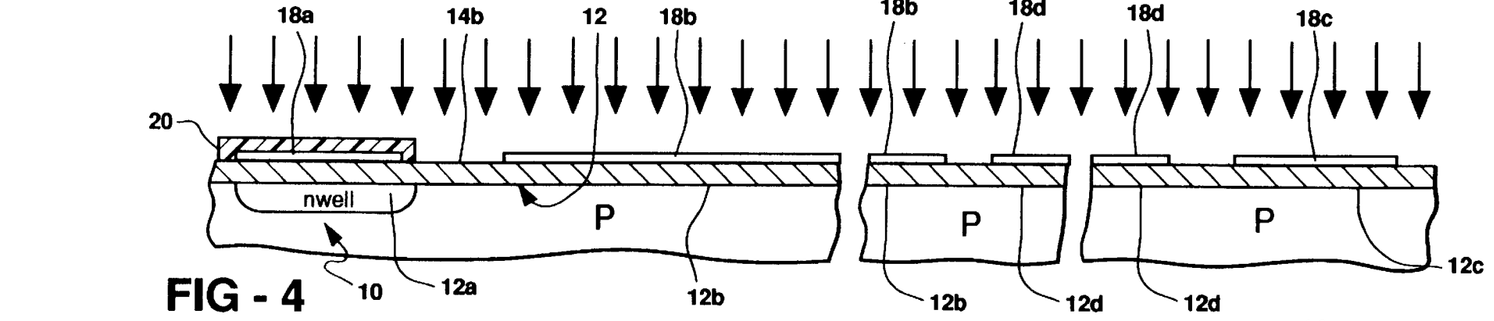

The silicon nitride islands 18a, 18b, 18c and 18d are also shown in FIG. 4. As will hereinafter be seen, silicon nitride island 18a covers an active area 12a where a p-channel IGFET will be formed. Silicon nitride island 18b covers a silicon surface active area 12b where an n-channel IGFET will be formed. Silicon nitride island 18c covers surface area 12c, where part of our distinctive EPROM is to be formed. Surface area 12d is an area where a substrate to poly capacitor will be formed. Surface area 12d is disposed between surface areas 12b and 12c, and is an "active area" not included in the description of the companion Attorney Docket H-188616.

FIG. 4 also shows that the surface 12 is given a field ion implantation. For this implantation, the n-well 16 is protected from the implant by a covering patch 20 of photoresist. The field implantation is of an p-type impurity such as boron. The implantation is done in a dose of about $1 \times 10^{13}$ to $1 \times 10^{14}$ atoms per square centimeter, at an energy of about 15 to 40 keV. The field implant does not cause a conductivity type change, and does not form a part of this invention. It is thus not shown in the drawing, to simplify understanding of the drawing.

Figure 5:
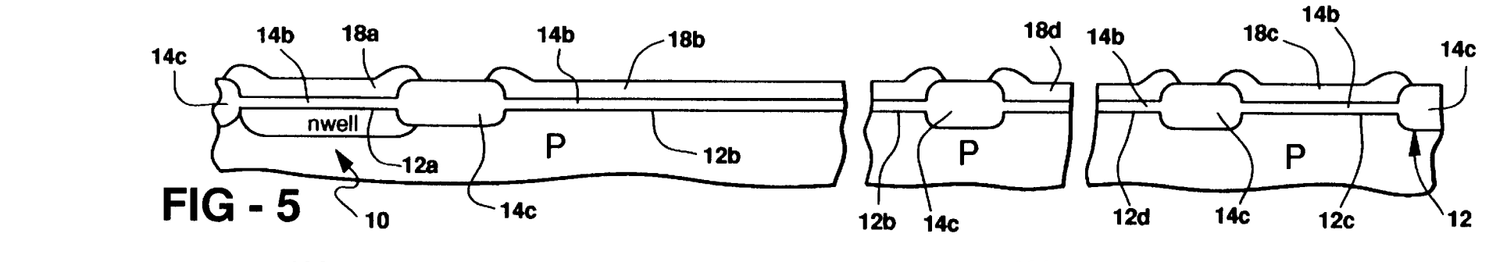

Reference is now made to FIG. 5. Following the field implant, the photoresist patch 20 is removed. Wafer 10 is then heated in an oxidizing atmosphere to thermally grow an 8500 angstrom thick silicon dioxide layer in all areas of silicon surface 12 that are not protected by the silicon nitride islands 18a, 18b, 18c and 18d. This 8500 angstrom thick thermal oxide is referred to as field oxide. It forms a thick oxide blanket or matrix 14c within which island-like thin oxide active areas 12a, 12b, 12c and 12d are integrally disposed.

After the desired thickness of field oxide is grown, the silicon nitride islands 18a–18d are removed, starting first with a silicon oxide etch to remove any silicon oxide surface film that may have formed on the silicon nitride during field oxidation. The silicon nitride islands 18a, 18b, 18c and 18d are then etched away, as well as the thin silicon dioxide layer 14b that each of them covered on surface active areas 12a, 12b, 12c and 12d.

Figure 6:
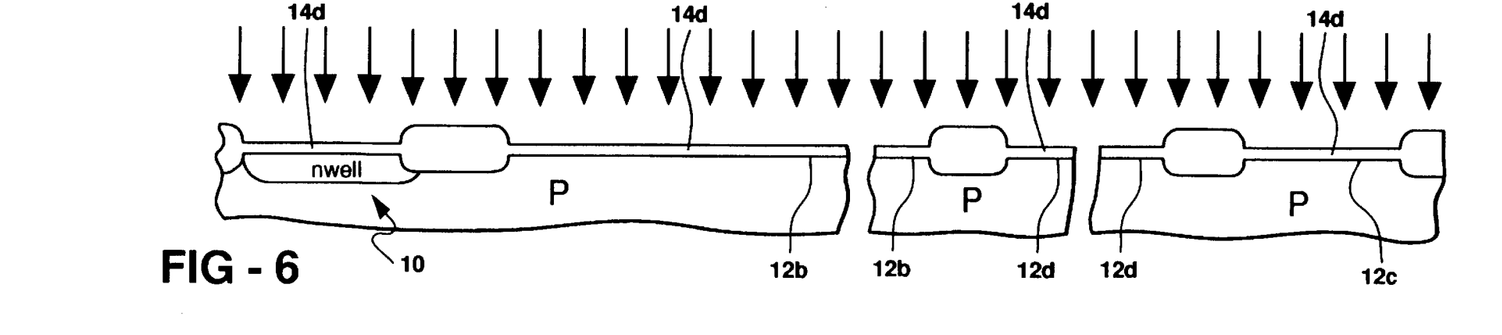

Referring now to FIG. 6, a 400 angstrom thick oxide layer 14d is then grown on the silicon surface active areas 12a, 12b, 12c and 12d. This silicon oxide layer 14d is preferably grown under conditions similar to those used to form gate oxide 14e of FIG. 8. Silicon wafer 10 is then given a blanket enhancement implant of the dopant boron at a dosage of about $1 \times 10^{11}$ to $1 \times 10^{13}$ atoms per square centimeter at an energy of about 20 to 60 keV. The enhancement implant adjusts threshold voltage of the MOS transistors involved. This enhancement implant will inherently also adjust the threshold voltage of our EPRCM on surface area 12d. The adjustment sets their threshold values to a predetermined level.

Figure 7:
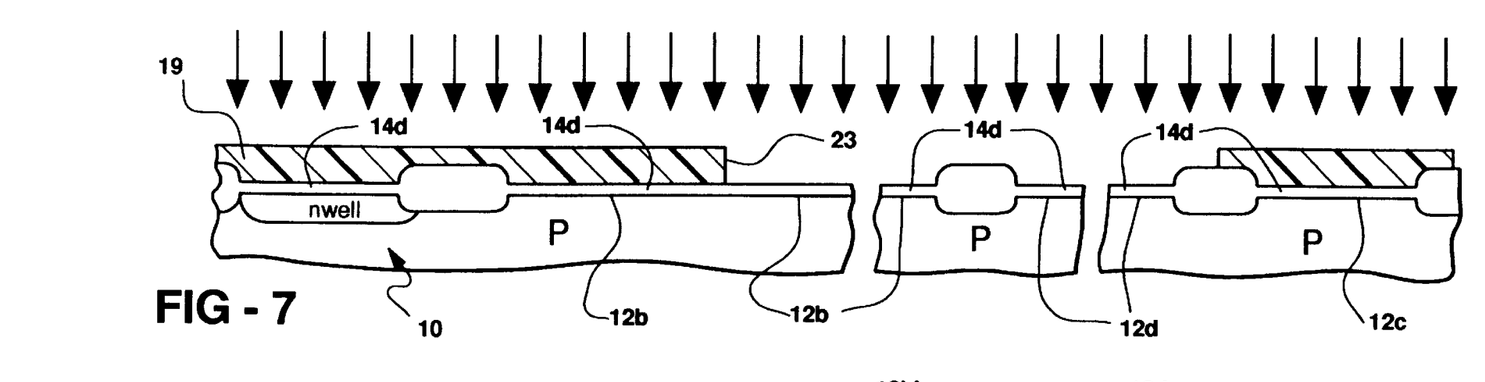

FIG. 7 shows that following the blanket enhancement implant, the upper surface of wafer 10 is given still another implant. However, before the implant, the upper surface of wafer 10 is covered with a photolithographically developed photoresist mask 19. The photoresist mask 19 is a blanket coating of resist that has a window 23. Window 23 exposes the enlarged right hand portion 12b' of "L" shaped silicon surface area 12b, as well as all of silicon surface area 12d. Accordingly, the edges of window 23 lie on the field oxide 14c except where it crosses the narrow left hand portion of silicon surface area 12b.

As shown in FIG. 7, the 400 angstrom thick silicon oxide layer 14d covers surface areas 12b' and 12d, which protects these areas during ion implantation. Silicon wafer 10 is then given a blanket implant of a dopant such as phosphorous. The dosage can be as desired, as for example about $1 \times 10^{15}$ to $1 \times 10^{16}$ atoms per square centimeter or even higher, at an energy of about 60 to 150 keV. This implant dopes surface areas 12b' and 12d to n-type conductivity, which is opposite in conductivity type from the p-type conductivity of wafer 10.

Figure 8:
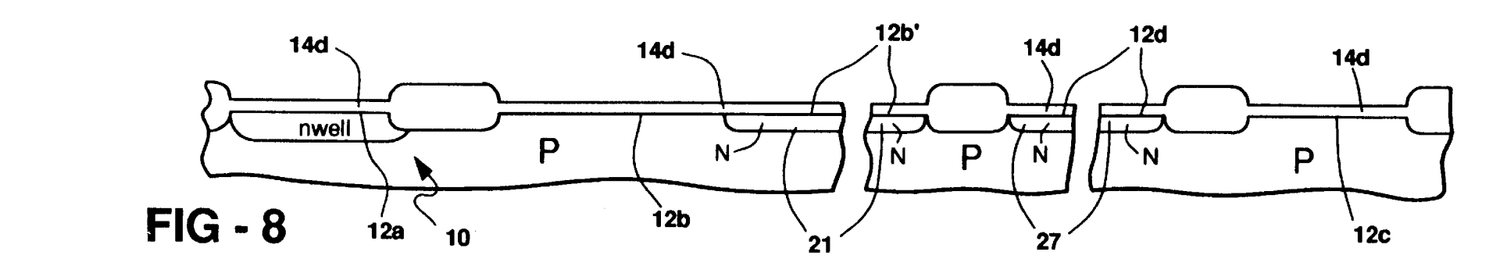

As shown in FIG. 8, the photoresist mask is then stripped off, and the wafer 10 heated to move the implanted ions from interstitial positions to lattice sites. If desired, this heating can be done later, and can be combined with a later subsequent heating. This creates n-type region 21 in the enlarged right portion 12b' of surface area 12b and n-type region 27 in surface area 12d. N-type region 21 will become the lower plate of a substrate to poly capacitor. N-type region 27 will become the charging gate, or electrode, of our distinctive EPROM.

Figure 9:
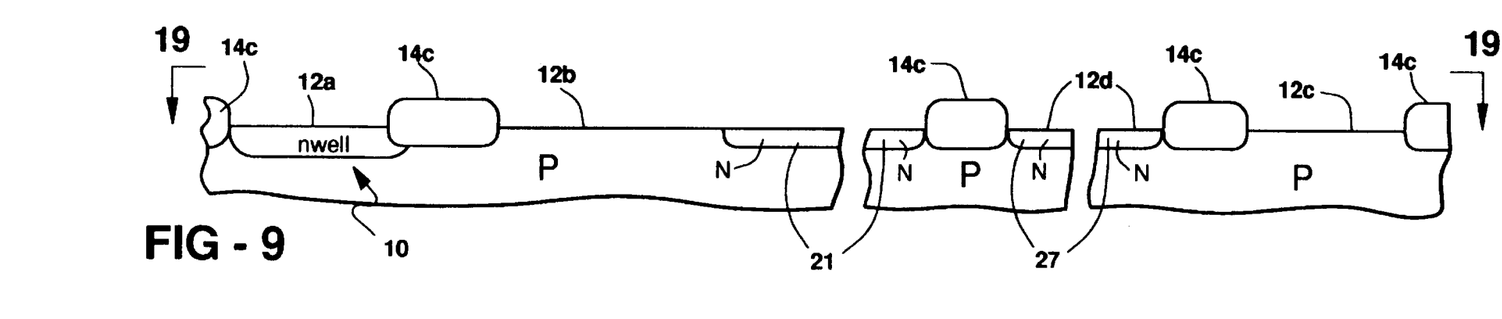

FIG. 9 shows that the 400 angstrom thick silicon oxide layer 14d is then etched away from silicon surface active areas 12a, 12b, 12c and 12d. When the oxide is removed the n-type regions 21 and 27 are uncovered. Regions 21 and 27 are shown in plan view in FIG. 19.

Figure 10:
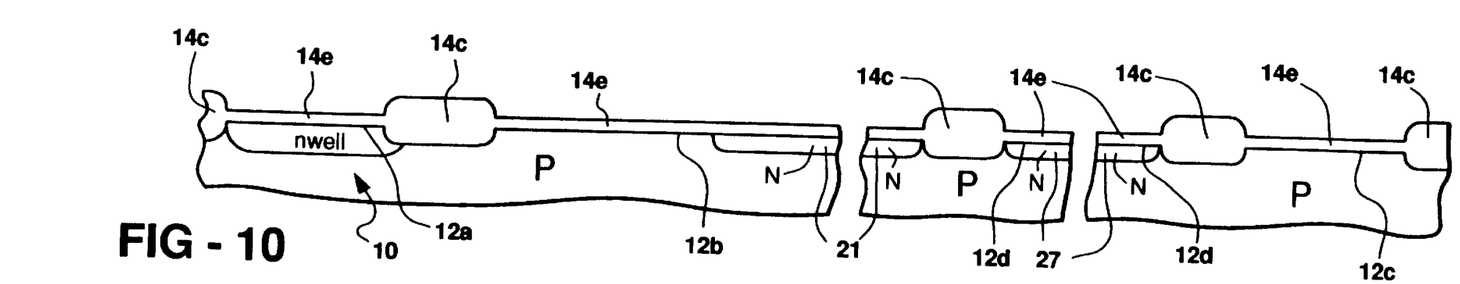

FIG. 10 shows that a new 400 angstrom thick layer 14e of silicon oxide is thermally regrown on the silicon surface areas 12a, 12b, 12c and 12d. This new thermal oxide layer 14e is clean and suitable for use as a gate oxide for the IGFETs and EPROMs subsequently to be formed on surface 12 of wafer 10.

Figure 11:
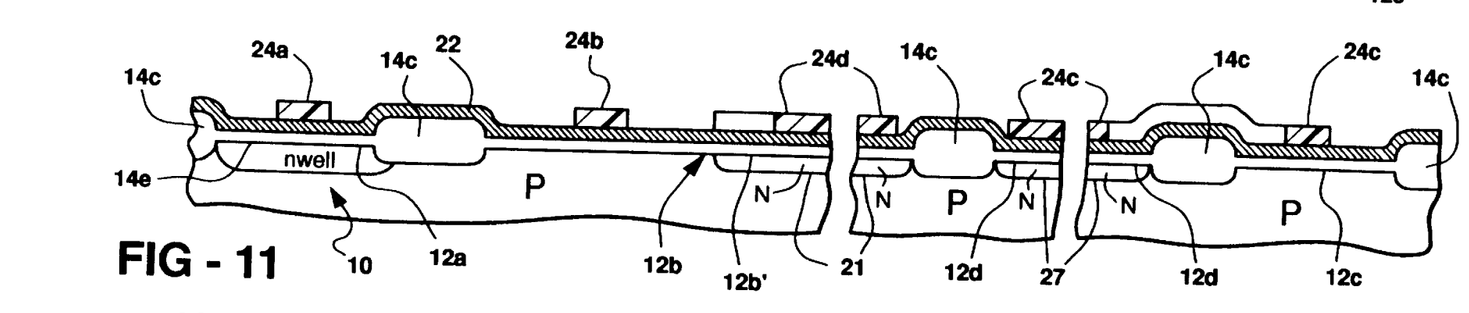

As can be seen in FIG. 11, a 3500 angstrom thick polycrystalline silicon blanket layer 22 is then deposited on top of the gate oxide/field oxide layer 14e/14c. Polycrystalline silicon is alternatively sometimes referred to herein as "polysilicon" or "poly". The poly blanket layer 22 is of Low Pressure Chemical Vapor Deposition (LPCVD) polycrystalline silicon that is doped with phosphorous or the like to be strongly n-type. As usual, conductivity, or doping, of the polycrystalline silicon layer 22 can be of the order of about 15 ohms per square to 1500 ohms per square. Doping can be done in any convenient manner. The poly layer 22 is deposited immediately after growing the gate oxide 14e, to preserve the high quality and purity of gate oxide layer 14eas a gate dielectric for an MOS transistor.

As FIG. 11 also shows, the polycrystalline silicon blanket layer 22 is covered with a photoresist mask that comprises patches, or mask elements, 24a, 24b, 24c and 24d. The patches 24a–24d have a plan view configuration respectively corresponding to the MOS gate electrodes 22a and 22b, the EPROM floating gate 22c (including its large extension, and the substrate to poly capacitor top electrode 22d. The photoresist mask patches 24a–24d leave exposed those portions of poly blanket layer 22 that are to be etched away. To do the etching, the exposed portions of polycrystalline silicon blanket layer 22 are first cleaned of any silicon oxide film incidentally formed thereon. Then, the exposed portions of the polycrystalline silicon blanket layer 22 are completely etched away in a normal and accepted manner. This etching defines a polycrystalline silicon pattern of electrodes and conductors on top of the silicon wafer 10.

Figure 12:
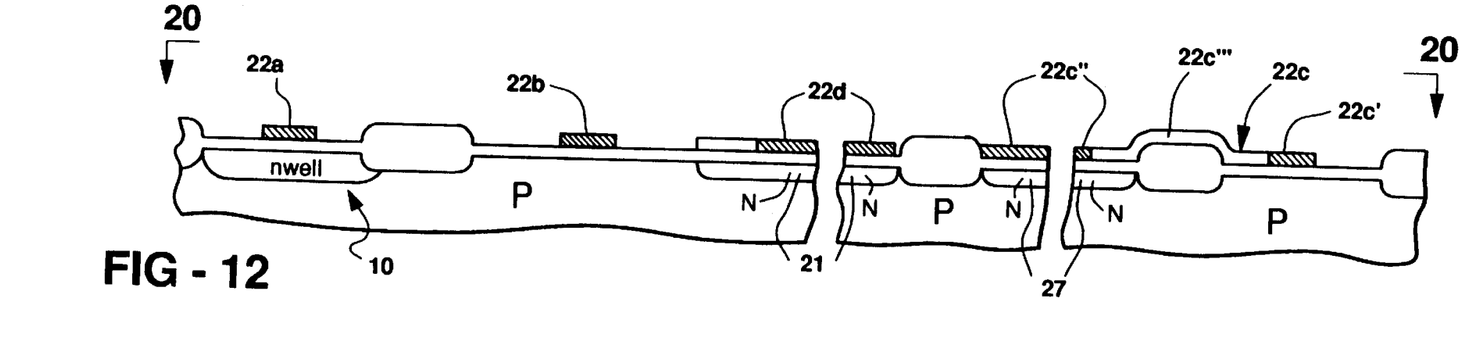
Figure 20:
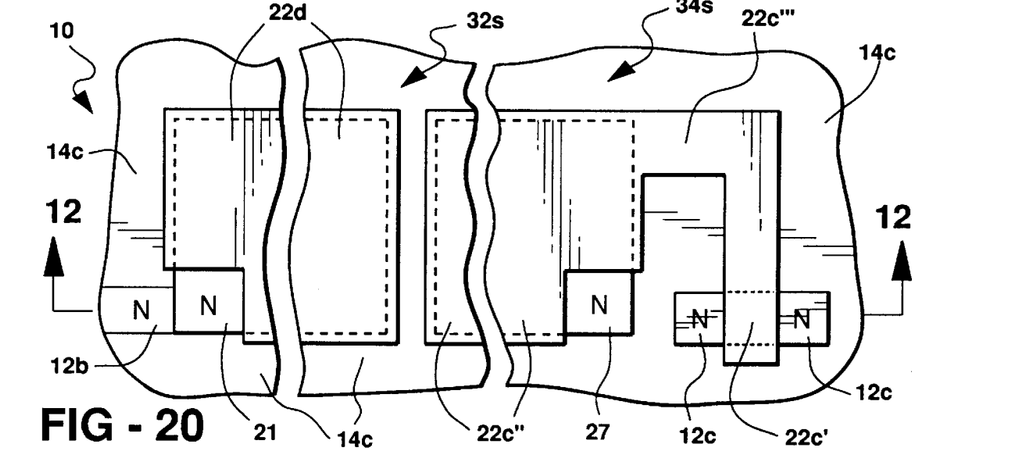
FIG. 20 shows a plan view of the substrate to poly capacitor and EPROM after definition of the poly top plate of the substrate to poly capacitor and of the EEPROM floating gate. The view is along the line 20—20 of FIG. 12.

After etching the polycrystalline silicon blanket layer 22 into the above-mentioned polycrystalline silicon pattern, the photoresist etch mask is removed. The result is the in-process configuration as shown in FIGS. 12 and 20. As indicated above, the poly pattern includes self-aligning gate electrodes 22a and 22b for the CMOS transistors to be respectively formed in active areas 12a and 12b, and integral extensions of those electrodes (not shown) and other associated conductors (also not shown). The poly pattern also includes an upper electrode 22d for a substrate to poly capacitor 32s over n-type region 21. The plan view size of n-type region 21 and upper electrode 22d would probably actually be much larger than shown. This is also true for n-type region 27. However, for convenience of illustration, their size is shown in a reduced form.

As indicated above, the polycrystalline silicon pattern also includes element 22c, which is an important part of this invention. Element 22c forms a floating gate electrode for the distinctive EPROM 34s of this invention. This further element 22c is distinctive in that it has a relatively small sized part 22c' over active area 12c and a relatively large sized part 22c" over region 27 of area 12d. As can be seen by reference to FIG. 20, these parts are connected by an integral arm-like extension 22c''' that crosses over a part of field oxide 14c. Element part 22c' centrally crosses silicon surface active area 12c. Hence, element part 22c' provides a self-aligned gate electrode for our distinctive EPROM 34s. In the EPROM 34s of this invention, element part 22c serves as an electrically floating gate.

Referring to FIGS. 12 and 20, the polysilicon element part 22c" that is disposed on the n-type region 27 is a relatively large, plate-like portion that forms a top plate for a substrate to poly capacitor that is integral with our EPROM 34s. As indicated above, the plan view size of part 22c", and of its underlying n-type area 27, would actually be much larger than shown, especially with respect to the size of extension 22c'''. However, for convenience of illustration, relative size of part 22c" has been reduced. More will be said later about the actual size of plate part 22c" (in comparison with part 22c' and arm-like extension 22c''') and capacitance between the floating gate 22c (primarily 22c") and the underlying n-type region 27, as that capacitance relates to the capacitance between floating gate 22c and the wafer (chiefly the EPROM channel region) of the substrate wafer 10.

In addition, extension 22c''' would probably have a somewhat different configuration in practice. It is shown as elongated and "L" shaped primarily for convenience of illustration, and for better comparison with the steps used in making plate 22d of the substrate to poly capacitor 32s that is concurrently formed. As will be explained later in this description, one would probably prefer a short and straight extension 22c''' on plate 22c, to minimize cell size. Such alternative configurations are disclosed in FIGS. 22-23 of the above-mentioned related Attorney Docket H-188616, which is incorporated herein by reference.

As indicated above, FIGS. 12 and 20 show the plan view configuration of the floating gate of our distinctive EPROM 34s along with a rather conventional poly plate of a substrate to poly capacitor 32s. As mentioned, floating gate 22c of our distinctive EPROM 34s has a large portion 22c" disposed on n-type region 27. It has an integral extension, the end 22c' of which crosses active area 12c. The part 22c' is sized (in plan view) to provide a relatively large capacitance between the floating gate 22 and the charging gate, which is n-type region 27. By relatively large, we mean that this capacitance is relatively large in comparison to the capacitance between the floating gate 22c and the substrate wafer 10. The floating gate to charging gate capacitance should be at least twice the capacitance between the floating gate and the wafer 10. If this ratio in floating gate/charging gate capacitance to floating gate/substrate capacitance is about two or greater, preferably 3:1 to 5:1, or still greater, the floating gate of the EPROM can be charged at low voltages, i.e., 14 volts or less, typically 8–12 volts. Such low voltages are of a level that can be safely handled by the high performance CMOS transistors. Hence, in this invention, the high performance CMOS transistors can be used for programming an EPROM IGFET. In other words, a separate group of higher voltage programming transistors need not be included in the circuit. This simplifies the resulting integrated circuit not only from a circuitry standpoint but also from a fabrication standpoint. Process steps to make the high voltage transistors need not be included. As hereinbefore indicated, adding steps to the preferred high performance CMOS process can compromise the performance of the high density CMOS transistors being made from the modified high performance CMOS process. Hence, our invention provides still another advantage.

Figure 13:
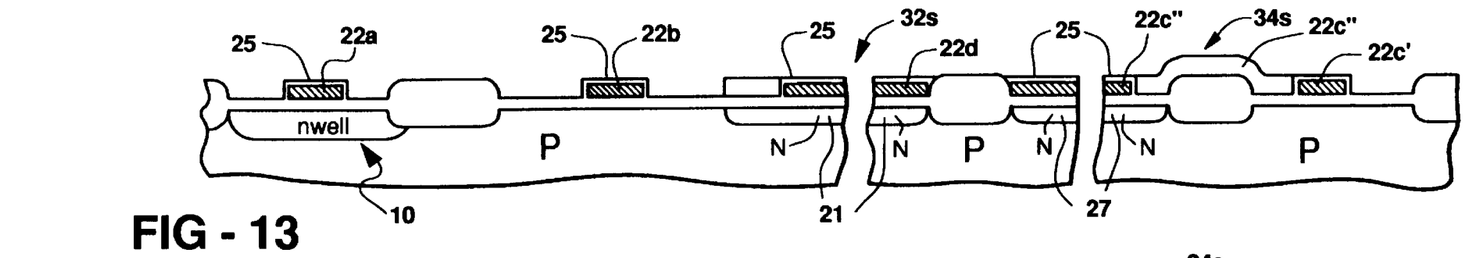

The next step of the high performance CMOS process with substrate to poly capacitor is shown in FIG. 13. As can be seen, a 200–350 angstroms thick silicon oxide layer 25 is grown on the exposed surfaces of the polycrystalline silicon pattern segments 22a, 22b, 22c and 22d. This seals the outer surface of these segments, to prepare them for the final steps of the process.

In the following steps of the process, the high performance MOS transistors, including our EPROM IGFET, are formed in the integrated circuit. As indicated above, the high performance MOS transistors are formed with geometries that provide gate nominal gate lengths of about two microns or less and attendant channel lengths of about 1.5 micron or less. The steps used to finish the integrated circuit are identical to what might be used in any high speed CMOS process that would include a substrate to poly capacitor.

Figure 14:
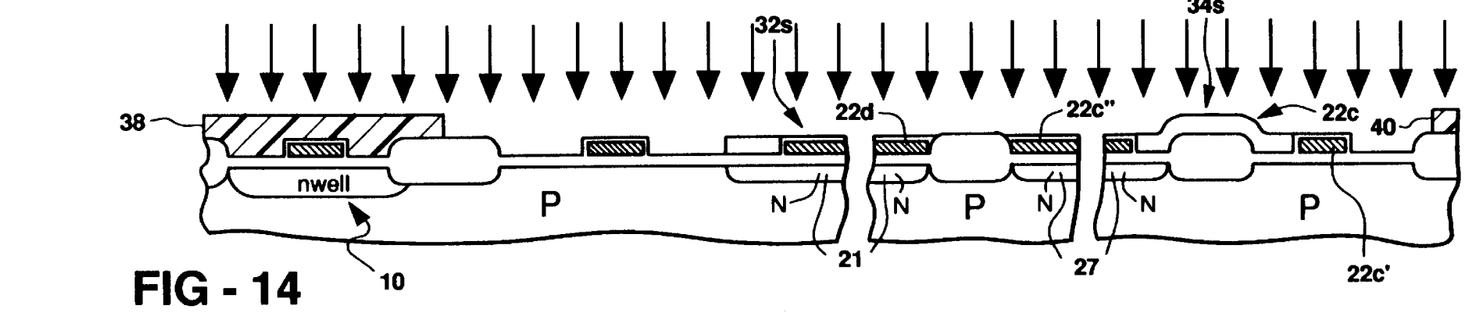

Next, as shown in FIG. 14, the upper surface of the silicon wafer 10 is masked with a thick blanket layer of photoresist 38. Window 40 is then photolithographically opened in the blanket photoresist layer 38 over the active areas 12b, 12c and 12d. As indicated above, an n-channel MOS transistor, i.e., IGFET, is to be formed in the small rectangular left-hand part of active area 12b. A substrate to pal[y]capacitor is to be formed in the large right-hand part of surface area 12b, interconnected with the MOS transistor in area 12b. Our distinctive EPROM is to be formed in surface areas 12c and 12d. Our distinctive EPROM includes a high density MOS transistor with floating gate formed in area 12c. An extension of the floating gate crosses over field oxide onto surface area 12d, where it is expanded into a large plate. As previously indicated, each chip on wafer 10 will have many areas such as active areas 12a–12d.

FIG. 14 also shows that silicon wafer 10 is then given an N+ implant. This implant is done to respectively form the self-aligned n-type source and drain regions 44a and 44b on opposite sides of the silicon gate electrode 22b, and the self-aligned n-type source and drain regions 44c and 44d on opposite sides of our EPROM silicon gate electrode part 22c__. Source and drain regions 44a–44d can be implanted in the usual manner, as for example with an implant of the n-type dopant arsenic or co-implant of the N-type dopants arsenic and phosphorous at a dosage $1 \times 10^{15}$ to $1 \times 10^{16}$ atoms per square centimeter at an energy of about 25 to 200 keV.

The photoresist 38 is then removed, and the surface of silicon wafer 10 is cleaned. Then, silicon wafer 10 is heated for an appropriate time to drive in the implanted dopant somewhat and to help move the implanted n-type dopant into substitutional positions in the crystal lattice of silicon active regions 12b and 12c. This heating results in the formation of N-type regions 44a, 44b, 44c and 44d. It can be seen that n-type region 44b is disposed in the right-hand end of the small rectangular area forming the base of the "L" shaped surface area 12b. N-type region 44b overlaps onto a corner of the previously formed n-type region 21 that was formed in the large rectangular upright part 12b' of "L" shaped surface area 12b. This provides an integral low resistance electrical connection between n-type regions 44b and 21. As previously mentioned, this connection is shown for convenience of illustration. Alternative layouts of these components might preferably have them in separated surface areas, and not interconnected directly.

Figure 15:
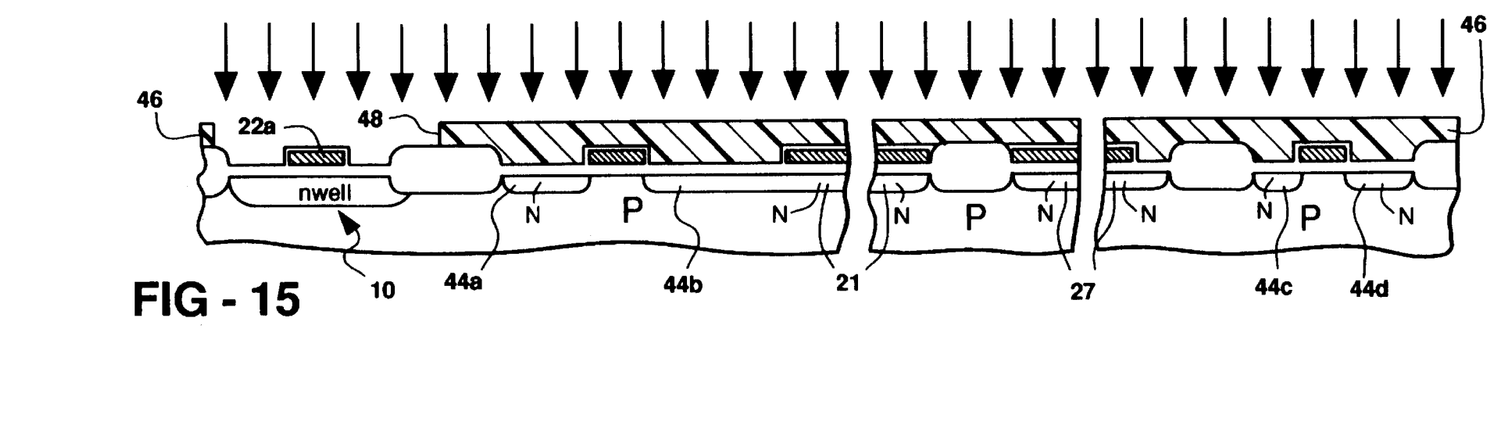

A new blanket layer 46 of photoresist is then applied to the upper surface of wafer 10. As shown in FIG. 15, a window 48 is then photolithographically opened in photoresist layer 46 over each active area 12a on the upper surface of silicon wafer 10. Active area 12a is disposed over each n-well 16, where a p-channel MOS transistor is to be formed. The upper surface of silicon wafer 10 is then given a blanket P+ implant using the p-type dopant boron or $BF_2$. The implant is at a dosage of about $5 \times 10^{14}$ to $6 \times 10^{15}$ atoms per square centimeter, and at an energy of about 20 to 80 keV.

Analogous to the preceding N+ implant, the P+ implant does not penetrate the photoresist layer 46, the 8500 angstrom thick field oxide, or the polycrystalline silicon self-aligned gate electrode 22a. On the other hand, it can penetrate the thin silicon oxide layer 14e on either side of the silicon gate 22a. Then, the photoresist layer 46 is removed. Thereafter, the silicon wafer 10 is heated to drive-in the implanted p-type dopant and move it into substitutional positions in the crystal lattice. This heating of the p-type implant forms p-type regions 50a and 50b in N-well 16. As can be seen, p-type regions 50a and 50b are self-aligned with the edges of silicon gate 22a. The upper surface of wafer 10 is then ready to begin the metallization process. Any of the normal and accepted techniques can be used.

Figure 16:
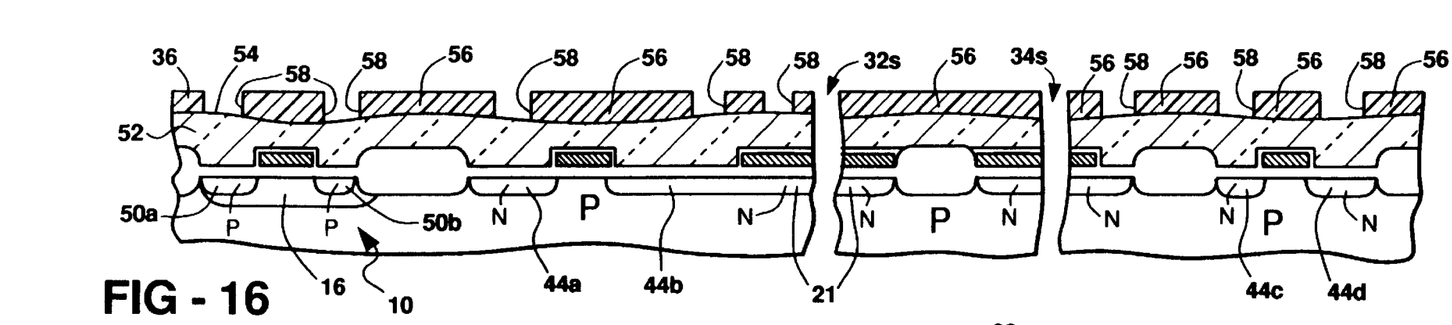

In one example of metallization, the upper surface of wafer 10 is given a blanket layer 52 of boro-phosphosilicate glass (BPSG) or phosphosilicate glass (PSG), as shown in FIG. 16. It can be deposited by low pressure chemical vapor deposition (LPCVD) or plasma enhanced chemical vapor deposition (PECVD) to a layer thickness of about 5000 angstroms. The blanket BPSG or PSG layer 52 is then densified in an appropriate heating step, which reflows it and smooths out its upper surface 54. One example of densification heating is to heat at about 900° C. for about 15 minutes.

A thin layer of a spin-on-glass (SOG) (not shown) can be applied onto the PSG layer upper surface 54, and then densified, as for example by heating at about 825° C. for about 10 minutes. This provides an even smoother and more impervious coating on the upper surface 54 of the PSG glass blanket layer 52.

A photoresist coating is then applied to the glass upper surface 54, and photolithographically defined into a contact mask that is comprised of segments 56. The contact mask has a contact window 58 over each area where an electrical contact is desired. The resultant upper surface of wafer 10 is shown in FIG. 16.

The upper surface of wafer 10 is then plasma etched or reactive ion etched to open contact windows in the glass layer 52. Concurrently, the etching also removes any silicon oxide layers exposed at the bottom of the contact windows. Such windows are opened to each of the source and drain regions 44a–44d and 50a–50b, and also to each gate electrode of the CMOS circuitry that requires a separate contact. However, the CMOS gates are ordinarily not contacted in the silicon surface active areas themselves. Instead, they are contacted in other locations, remote from the channel region of the MOS transistor for which they are a gate. In some instances, the polycrystalline silicon itself forms a connecting network between MOS transistors so that no direct metal contact to each gate is necessary. Accordingly, and for simplicity, in FIG. 18 no gate contact window is shown opened to the gate electrodes 22a, 22b and 22c that are respectively above active areas 12a, 12b, and 12c.

Figure 17:
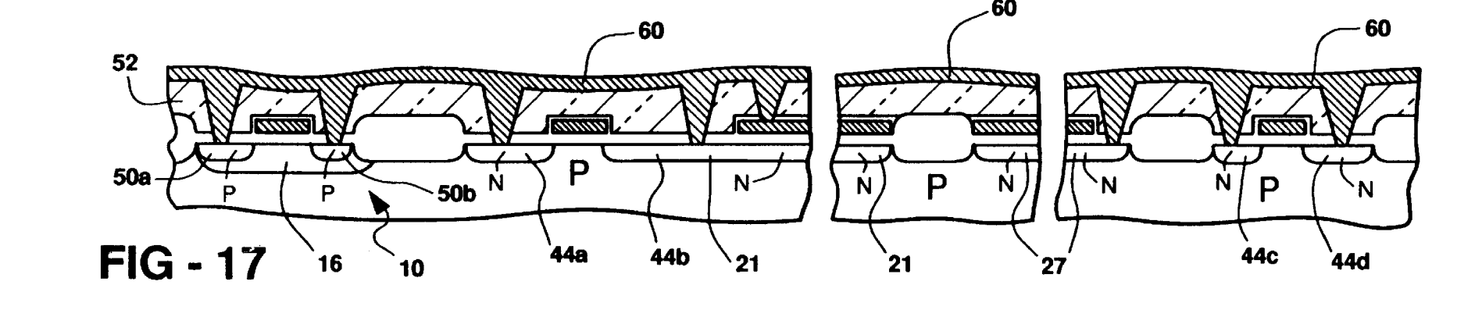
Figure 18:
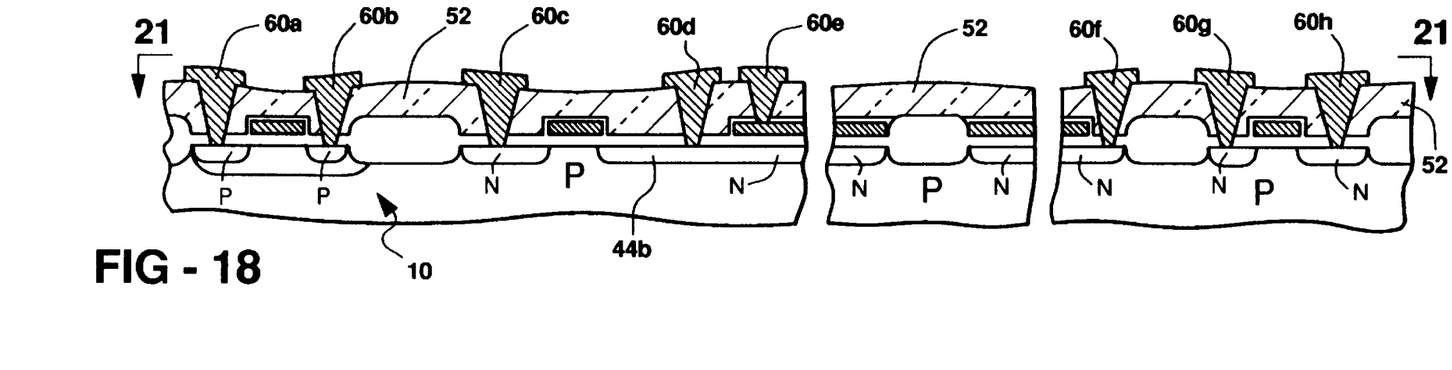
Figure 21:
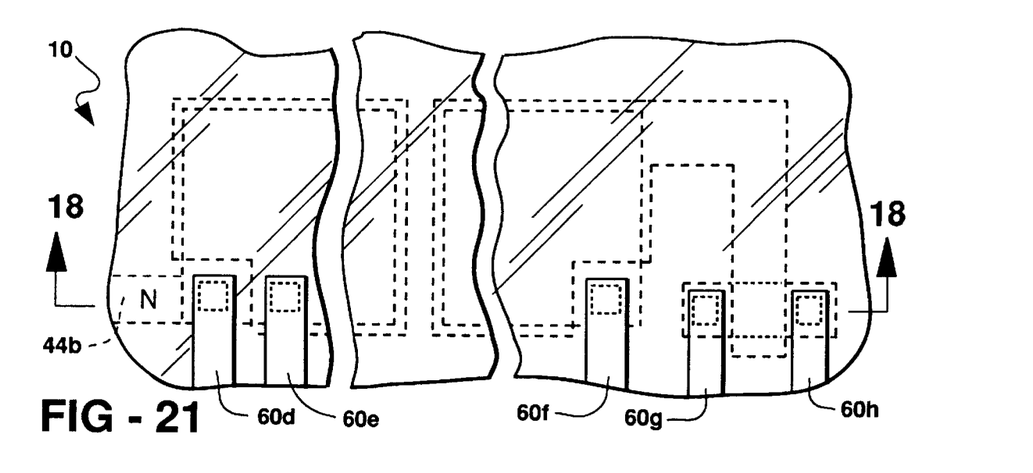
FIG. 21 shows a plan view of the substrate to poly capacitor and our EPROM after metal electrodes have been formed. The view is along the line 21—21 of FIG. 18.

In addition, as can be seen from FIGS. 17, 18 and 21, a separate contact window is opened to each of the N+ substrate diffusion areas 21 and 27, so that separate and appropriate electrical potentials can be applied to them. Concurrently, a contact window is opened to the poly plate 22d over n-type region 21. In this manner, a separate electrical potential can be applied to the top plate of the substrate to poly capacitor 32s. No contact window is opened to the poly plate 22c of our EPROM, since poly plate 22c is an electrically floating gate of our EPROM. It is to be noted that the source and drain regions of our EPROM are to be contacted, analogous to the contacts made to the source and drain of each MOS transistor. Accordingly, windows are opened in the glass layer 52 to accommodate them, as is indicated above.

After the contact windows are opened in the glass layer 52, the photoresist etch mask is removed and a blanket coating 60 of one or more contact metals is deposited onto the upper surface 54 of the glass layer 52. In one example, a single layer of an aluminum alloy could be used. The result is as shown in FIG. 17.

The blanket coating 60 of contact metal is then photolithographically masked and etched, to delineate a plurality of metal contacts 60a–60h on the surface 54 of glass layer 52, as seen in FIGS. 18 and 21. Any of the conventional metallization masking and etching techniques can be used to form contacts 60a–60h. Contact 60a is in low resistance electrical contact with region 50a. Contact 60b is in low resistance electrical contact with region 50b. Contact 60c is in low resistance electrical contact with region 44a. Contact 60d is in low resistance electrical contact with the large n-type region 21. Contact 60e is in low resistance electrical contact with the poly plate 22d of the substrate to poly capacitor 32s. Contact 60f is in low resistance electrical contact with large n-type region 27 under the extension part 22c''' of floating gate 22 for our EPROM 34s. Contact 60g and 60h are respectively in low resistance electrical contact with n-type regions 44c and 44d of our EPROM 34s. Contacts 60a–60c are analogous in plan view to contacts 60d–60h that are shown in FIG. 21.

Our EPROM cell comprises the elements on substrate surface portions 12c and 12d. As indicated above, the large portion 22c''' of the EPROM floating gate, and its underlying n-type area 27, are sized to provide a significantly larger capacitance than exists between floating gate 22c and p-type silicon substrate 10. By including these large elements in the EPROM cell, the cell becomes larger. However, it permits one to achieve a higher ratio in the charging gate to floating gate capacitance (Ccg-fg) divided by the floating gate to substrate capacitance (Cfg-s). As repeated above, the ratio of Ccg-fg/Cfg-s should be at least about 2. This permits the floating gate to be charged at lower voltages, typically of less than about 12 volts. This is compatible with CMOS circuits that use a five volt supply voltage and have a breakdown voltage of about 17 volts.

EPROM floating gate portion 22c''' is substantially registered over substrate n-type region 27, and lies substantially within it when seen in plan view. In this connection, see FIG. 20. Hence, they have a large area of overlap. Since this large overlapping area is only separated by a relatively thin layer of dielectric, floating gate 22c and substrate n-type region 27 can have a relatively large capacitance between them. On the other hand, except for its part that crosses the small active area 12c, floating gate 22c is either disposed within the n-type region 27 or on the relatively thick field oxide 14c. It therefore has a relatively low, and at least significantly lesser, capacitance with its underlying parts of silicon substrate 10 than it has with substrate n-type region 27.

The arm-like extension 22c''' of the floating gate 22c comprises only a relatively small part of the total area of electrode 22c. Accordingly, the arm-like extension 28c''' adds little to the capacitance between floating gate 22d and the wafer 10. In fact, in actual practice, one would probably not have much, if any length to arm 22c''', as is pointed out in the next paragraph.

As mentioned above, FIG. 20 shows a top view of the substrate to poly capacitor 32s and of our EPROM 34s. In the FIG. 20 view, the dielectric between the polysilicon layers is not shown, to better illustrate the comparison of the polysilicon plates 22c and 22d. FIG. 20 shows that floating gate 22c has an arm-like extension 28c''' such as mentioned in the preceding paragraph. Floating gate 22c is only shown as "U" shaped for ease of illustration and for easier comparison of our EPROM 34s with the substrate to poly capacitor 32s and with the high density CMOS circuitry. However, we recognize that any appreciable length to the arm-like extension 22b''' s not necessary, and even undesirable. For manufacturing reasons, we prefer that floating gate arm portion 22c''' be as short as possible, and even omitted if possible. This can be done with different configurations of floating gate 22c that are not "U" shaped in plan view. Moreover, any extension in the arm 22c''' can even cause a reduction in the capacitance ratio Ccg-fg/Cfg-s.

Accordingly, we prefer that charging gate 28b not even have arm-like extension 28b''', which includes its end 28b'. FIG. 22 and 23 of the companion application Attorney Docket H-188616 show such an alternative embodiment.

It should also be mentioned that various alternative layouts of the components described above can be made, as well as various alternative layouts of conductors for electrical connection to them. The layouts shown are only for illustration and are intended to represent but one of many possible, and perhaps preferred, layouts. For example, if n-type region 44b does not overlap onto n-type region 21, or if region 21 is in a separate surface area, a separate metallization contact would need to be provided for region 44b, such as is provided for n-type region 44a. Also, one may choose to have a poly runner extend from the poly plate 22d to other parts of the circuit, instead of providing a separate metallization contact to it. Other layouts for region 27 are also possible, including different surface geometries and surface areas where it is disposed alone or in combination with other elements of the circuit.

The foregoing discussion discloses and describes several exemplary embodiments of the present invention. One skilled in the art will readily recognize from such discussion, and from the accompanying drawings and claims, that various changes, modifications and variations can be made therein without departing from the spirit and scope of the invention as defined in the following claims.

We claim:

1. A method of making an integrated circuit on a substrate of semiconductor material, which integrated circuit includes MOS transistors, a substrate to poly capacitor and at least one EPROM transistor, said method comprising the steps of:

forming MOS transistors on thin oxide areas of said substrate using a process having about two micron or less design rules for the MOS transistors;

forming at least one substrate to poly capacitor on said substrate, said capacitor comprising a first substrate surface region doped to opposite conductivity type as a first capacitor plate and an overlying layer of polycrystalline silicon as a second capacitor plate;

concurrently also forming at least one EPROM transistor on said substrate using a selected combination of steps used to make the MOS transistors and the substrate to poly capacitor, said EPROM transistor having a polycrystalline silicon floating gate over its channel region of given conductivity type and area, and the floating gate having an extension over a second substrate surface area doped to opposite conductivity type, said extension and second area having a large area of overlap in comparison with the area of said channel and having a spacing in said area of overlap less than field oxide thickness on adjacent areas of said substrate, wherein the EPROM transistor has a doped second area/floating gate first capacitance, and a floating gate/substrate second capacitance; and providing a respective capacitance ratio between said first and second capacitances of about two:one or greater;

effective to allow the EPROM transistor to be made along with the high speed MOS transistors and the substrate to poly capacitor by merely incorporating changes in masks used to make said integrated circuit, and the floating gate of the EPROM transistor can be charged at voltages that can be handled by said high speed MOS transistors.

2. The method of claim 1 wherein:

a single substrate doping step is used to concurrently form the first doped region for the substrate to poly capacitor and the second doped region for the EPROM's charging gate.

3. The method of claim 2 wherein:

the capacitor's first doped region and its overlying polycrystalline silicon plate are spaced by a dielectric;

the EPROM's second doped region and its overlying floating gate are spaced by a dielectric; and dielectric spacing between the capacitor's substrate first doped region and its overlying layer of polycrystalline silicon is the same as dielectric spacing between the EPROM's charging gate second doped region and its floating gate.

4. The method of claim 2 wherein:

dielectric thickness and composition between the capacitor's first doped region and its overlying layer of polycrystalline silicon is the same as dielectric thickness and composition between the EPROM's charging gate second doped region and its overlying floating gate.

5. The method of claim 4 wherein:

the capacitance ratio is about 2:1 to 5:1.

6. The method of claim 1 wherein:

said EPROM has source and drain regions that are disposed in one active area on said substrate;

said EPROM charging gate diffusion region is disposed on another active area on said substrate; and the EPROM floating gate extends over field oxide from the one active area to the other active area.

7. The method of claim 6 wherein:

the extension of the EPROM transistor floating gate that is disposed in the other active area has an area that is more than twice the area of portions of the floating gate disposed in the one active area.

8. The method of claim 6 wherein:

the EPROM charging gate diffusion region occupies the entirety of the other active area.

9. A method of making an EPROM transistor in a CMOS integrated circuit made with a process having two micron or less design rules, comprising the steps of:

forming a matrix of field oxide on a surface of a semiconductive substrate, said matrix delineating a plurality of active areas that are spaced on said surface by said field oxide;

forming a well of one conductivity type in an active area portion of opposite conductivity type in said substrate; said well extending into said substrate from said surface;

forming a first doped region of opposite conductivity type on an active area of said substrate, which first region is large enough in surface area to serve as a bottom plate of a substrate to poly capacitor;

forming a second doped region of opposite conductivity type on an active area of said substrate, which second region will provide a first capacitance with an overlying floating gate of an EPROM;

forming a dielectric coating of MOS transistor gate dielectric thickness on at least said active areas of said surface;

depositing a blanket layer of gate electrode material over said dielectric coating;

defining said blanket layer of gate electrode material into gate electrodes for complementary MOS transistors, an upper plate for a substrate to poly capacitor, and a floating gate for an EPROM MOS transistor, said floating gate electrode having an integral extension that extends from a channel area of said EPROM onto said dielectric coating covering said second doped region, said floating gate extension being enlarged over said second doped region so that it substantially covers said second doped region and capacitance between said floating gate and said second doped region is at least about double capacitance between said floating gate and said substrate;

forming source and drain regions for said MOS transistors under said dielectric coating at opposed edges of said gate electrodes including said floating gate electrode, with the source and drain regions being of opposite conductivity type from the substrate surface in which they are disposed;

forming a blanket dielectric coating on said substrate over said gate electrodes;

forming appropriate conductive connections to said source and drain regions, said first and second doped regions in said substrate, and to said MOS gate electrodes but not to said floating gate electrode, effective to make an EPROM in said CMOS integrated circuit that has an electrically floating gate that can be charged at voltages handled by said MOS transistors in said integrated circuit.

10. The method of claim 9 wherein:

the substrate is a wafer of p-type silicon;

the dielectric coating is thermally formed gate oxide; and the blanket layer of gate electrode material is polycrystalline silicon.

11. The method of claim 10 wherein:

the floating gate to second doped region capacitance has a ratio to the floating gate to substrate capacitance of about 2:1 to 5:1.

12. An integrated circuit that has one gate electrode layer, MOS transistors, a substrate to gate electrode material capacitor and at least one EPROM transistor, said integrated circuit comprising:

MOS transistors on a surface of a semiconductive substrate, said MOS transistors having channel lengths less than about two microns;

at least one substrate to gate electrode material capacitor on an area of said substrate, said capacitor comprising a first region of said substrate doped to opposite conductivity type, a dielectric layer, and an overlying layer of gate electrode material;

at least one EPROM transistor on an area of said substrate, with the EPROM transistor having an electrically floating gate electrode, said floating gate electrode having an integral extension that extends from a channel area of said EPROM onto a dielectric coating covering a second region of said substrate doped to opposite conductivity type, said floating gate extension being enlarged as compared to said EPROM channel area so that it substantially covers said second doped region and capacitance between said floating gate and said second doped region is at least about double capacitance between said floating gate and said substrate;

effective to allow the EPROM transistor to be made along with the MOS transistors and the capacitor by merely incorporating changes in masks used to make said integrated circuit, and the floating gate of the EPROM can be charged at low voltages that can be handled by said MOS transistors.

13. The integrated circuit of claim 12 wherein:

the semiconductive substrate is silicon;

the gate dielectric material is thermally grown silicon oxide; and the gate electrode material is polycrystalline silicon.

14. The integrated circuit of claim 13 wherein:

said floating gate electrode extension is enlarged substantially only in its portion disposed over said second doped region of said substrate; and the enlarged portion is disposed substantially within the periphery of said second doped region.

15. The integrated circuit of claim 14 wherein:

the channel area of said EPROM is disposed in one active area on said surface; and the second doped area of the substrate is disposed in a another active area of the substrate, wherein the floating gate electrode extension crosses field oxide to extend onto the second doped area.

16. The integrated circuit of claim 15 wherein:

the second doped area occupies substantially all of the other active area in which it is disposed.

17. The integrated circuit of claim 16 wherein:

the capacitance between said floating gate and said second doped region is about two to five times the capacitance between said floating gate and said substrate.

* * * * *